US012591023B2

(12) United States Patent (10) Patent No.: US 12,591,023 B2
Ogawa et al. (45) Date of Patent: Mar. 31, 2026

(54) ABNORMALITY LOCATING SYSTEM

(71) Applicant: Daifuku Co., Ltd., Osaka (JP)

(72) Inventors: Daisuke Ogawa, Hinocho (JP); Ken Tokunaga, Hinocho (JP); Masaki Hirano, Hinocho (JP); Akira Murota, Hinocho (JP)

(73) Assignee: Daifuku Co., Ltd., Osaka (JP)

( * ) Notice: Subject to any disclaimer, the term of this patent is extended or adjusted under 35 U.S.C. 154(b) by 162 days.

(21) Appl. No.: 18/744,263

(22) Filed: Jun. 14, 2024

(65) Prior Publication Data

US 2024/0418798 A1      Dec. 19, 2024

(30) Foreign Application Priority Data

Jun. 15, 2023      (JP) ................................. 2023-098528

(51) Int. Cl.
*G01R 31/58* (2020.01)

(52) U.S. Cl.
CPC .................................... *G01R 31/58* (2020.01)

(58) Field of Classification Search
None
See application file for complete search history.

(56) References Cited

U.S. PATENT DOCUMENTS

| | | | | | |
|---|---|---|---|---|---|
| 4,372,693 | A | * | 2/1983 | Lutz | ........................ G08B 17/06 |
| | | | | | 324/519 |
| 4,584,523 | A | * | 4/1986 | Elabd | ................... G01R 15/146 |
| | | | | | 324/105 |

| | | | | | |
|---|---|---|---|---|---|
| 6,782,329 | B2 | * | 8/2004 | Scott | .................... H02H 1/0015 |
| | | | | | 361/45 |
| 6,995,565 | B1 | * | 2/2006 | Tulloch | ................ G01R 31/308 |
| | | | | | 324/544 |
| 12,280,676 | B2 | | 4/2025 | Cho et al. | |
| 12,512,660 | B2 | * | 12/2025 | Yamamoto | ............... H02H 3/16 |
| 2018/0364294 | A1 | | 12/2018 | Herlong, II et al. | |

FOREIGN PATENT DOCUMENTS

| | | |
|---|---|---|
| JP | 10201006 A | 7/1998 |
| JP | 20094123 A | 1/2009 |
| JP | 202291150 A | 6/2022 |

* cited by examiner

*Primary Examiner* — Richard Isla

(74) *Attorney, Agent, or Firm* — The Webb Law Firm

(57) ABSTRACT

An abnormality locating system includes a display device, a controller, and a storage storing map data of a power feeder. The controller includes a distance information obtainer that obtains distance information indicating a distance from a power supply to a location of the abnormality, and an abnormality site display processor. The abnormality site display processor performs an abnormality site estimation process of estimating a location of an abnormality site based on the distance information, the abnormality site is a site of the abnormality of the thermal line, and a display process of causing the display device to display a map indicating a position of the thermal line based on the map data and to display, on the map, an estimated position of the abnormality site estimated through the abnormality site estimation process.

6 Claims, 5 Drawing Sheets

ABNORMALITY LOCATING SYSTEM

CROSS-REFERENCE TO RELATED APPLICATION

This application claims priority to Japanese Patent Application No. 2023-098528 filed Jun. 15, 2023, the disclosure of which is hereby incorporated by reference in its entirety.

BACKGROUND OF THE INVENTION

Field of the Invention

The present invention relates to an abnormality locating system for locating an abnormality of a thermal line in a power feeder including a feed line extending along a movement path of a movable body to feed power to the movable body, and the thermal line extending along the feed line.

Description of Related Art

An example of such a power feeder is described in Japanese Unexamined Patent Application Publication No. 10-201006 (Patent Literature 1). In the background described hereafter, reference signs in parentheses are the reference signs in Patent Literature 1. The power feeder described in Patent Literature 1 includes an induction line (14) extending along a movement path of a transport vehicle (V) to feed power to the transport vehicle (V), a thermal line (15) extending along the induction line (14), and a protection device (25). The protection device (25) includes a direct current (DC) power supply (33) connected to a pair of conductive wires (17) included in the thermal line (15) and includes a detection resistance (34) connected in series to the conductive wires (17) and a meter relay (35) connected in parallel to the detection resistance (34) to detect short-circuiting on any conductive wire (17). In response to the conductive wire (17) being short-circuited, the short-circuit point of the conductive wire (17) can be determined by tracking, using the meter relay (35), a current value that changes based on the position of the short-circuit point of the conductive wire (17).

In response to an abnormality such as short-circuiting on a thermal line, an operator responding to abnormalities is to easily determine the estimated position of the abnormality site on a wiring layout of the thermal line to improve the work efficiency. The technique described in Patent Literature 1 allows the operator to determine the distance along the thermal line to a short-circuit point as the position of the short-circuit point on the thermal line. The thermal line is, however, often wired along complex paths, and thus the operator may have difficulty in determining the short-circuit point on the wiring layout of the thermal line by simply learning the distance to the short-circuit point. This easily lowers the work efficiency of the operator removing the abnormalities.

SUMMARY OF THE INVENTION

Techniques are awaited for the operator to easily determine, in response to the abnormality on the thermal line, the estimated position of the abnormality site on the wiring layout of the thermal line.

An abnormality locating system according to an aspect of the disclosure is a system for locating an abnormality of a thermal line in a power feeder. The power feeder includes a feed line extending along a movement path of a movable body to feed power to the movable body, a power supply connected to the feed line to feed power to the feed line, the thermal line extending along the feed line, and an abnormality detector to detect an abnormality of the thermal line. The system includes a display device that displays information, a controller that controls the display device, and a storage storing map data of the power feeder. The map data includes power supply positioning information indicating a position of the power supply, feed line positioning information indicating a position of the feed line connected to the power supply, and thermal line positioning information indicating a position of the thermal line along the feed line. The controller includes a distance information obtainer and an abnormality site display processor. The distance information obtainer, in response to the abnormality detector detecting an abnormality of the thermal line, obtains distance information indicating a distance from the power supply to a location of the abnormality. The abnormality site display processor performs an abnormality site estimation process of estimating a location of an abnormality site based on the distance information, the abnormality site being a site of the abnormality of the thermal line, and a display process of causing the display device to display a map indicating the position of the thermal line based on the map data and to display, on the map, an estimated position of the abnormality site estimated through the abnormality site estimation process.

With the structure according to the above aspect, when an abnormality, such as short-circuiting or disconnection, is detected on the thermal line, the estimated position of the abnormality site can be displayed on a map indicating the layout of the thermal line (specifically, on a wiring layout of the thermal line) displayed on the display device. The operator can thus easily determine the estimated position of the abnormality site on the wiring layout of the thermal line based on the information displayed on the display device. This allows the operator to easily determine the abnormality site on the thermal line in the power feeder when, for example, the operator goes to the abnormality site for inspection or repair.

As described above, this structure allows the operator to easily determine the estimated position of the abnormality site on the wiring layout of the thermal line.

Further aspects and features of the abnormality locating system will be apparent from embodiments described below with reference to the drawings.

BRIEF DESCRIPTION OF THE DRAWINGS

Figure 8:
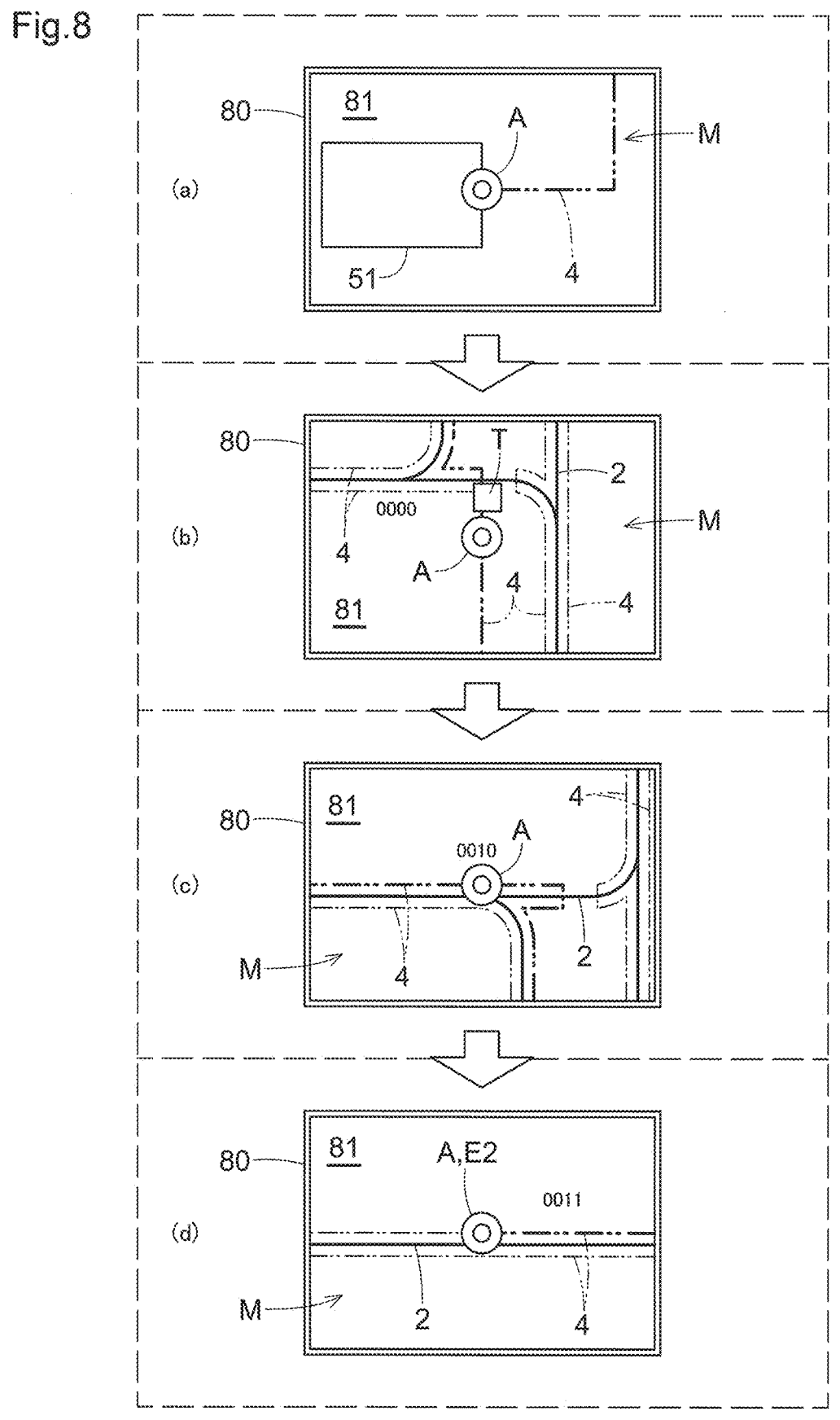

FIG. 8 is a diagram showing example transition of a display screen.

DESCRIPTION OF THE INVENTION

An abnormality locating system according to one or more embodiments will be described with reference to the drawings. An abnormality locating system S locates an abnormality of a thermal line 4 in a power feeder 100 (a power feeder facility).

The power feeder 100 feeds power to movable bodies 1 moving along a movement path 2. In the present embodiment, the power feeder 100 uses a wireless power feeding technique to feed power to the movable bodies 1.

Figure 1:
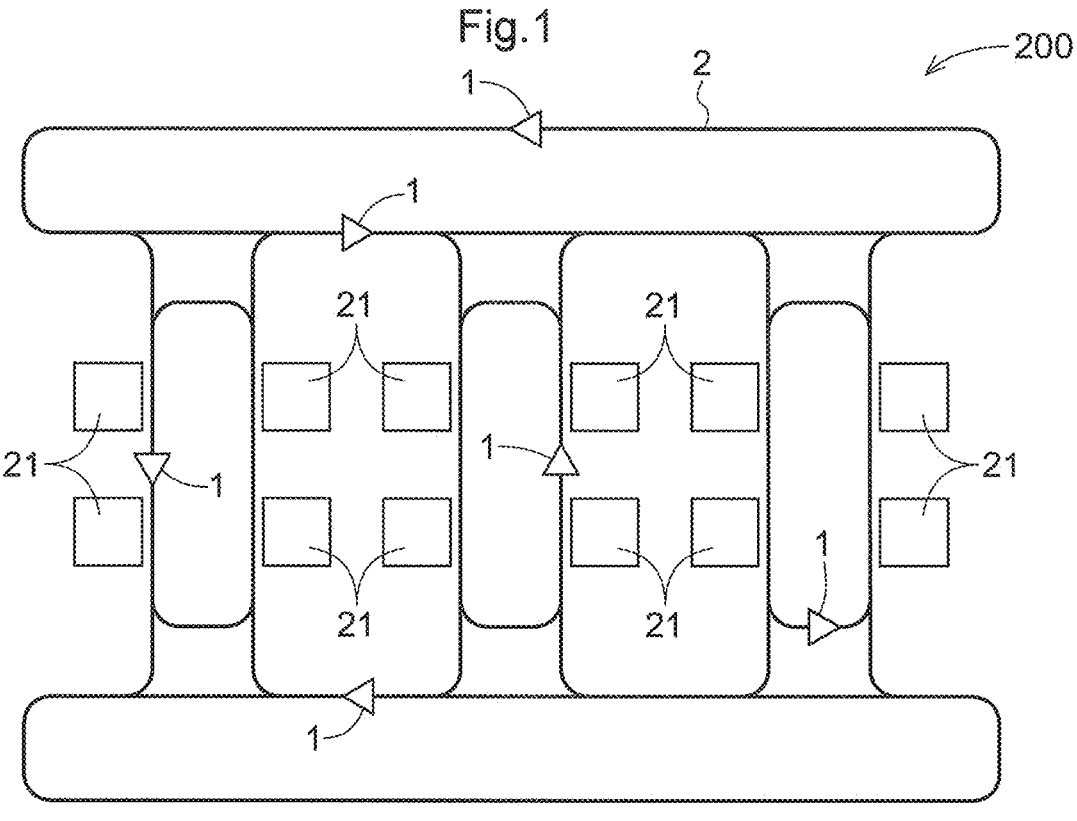
FIG. 1 is a diagram of an example layout of a movement path for a movable body.

FIG. 1 shows an article transport facility 200 as an example of a facility in which the power feeder 100 is used. In the example shown in FIG. 1, the movement path 2 allows passage through processors 21, in which the articles (or objects contained in the articles) that are not shown are to be processed, and the movable bodies 1 (automatic guided vehicles in this example) move along the movement path 2 to transport the articles. For example, an article to be processed in a processor 21 is loaded to the processor 21 by a movable body 1, and the article that has been processed in the processor 21 is unloaded from the processor 21 by the movable body 1. The article is, for example, a front opening unified pod (FOUP) that contains semiconductor wafers.

Figure 3:
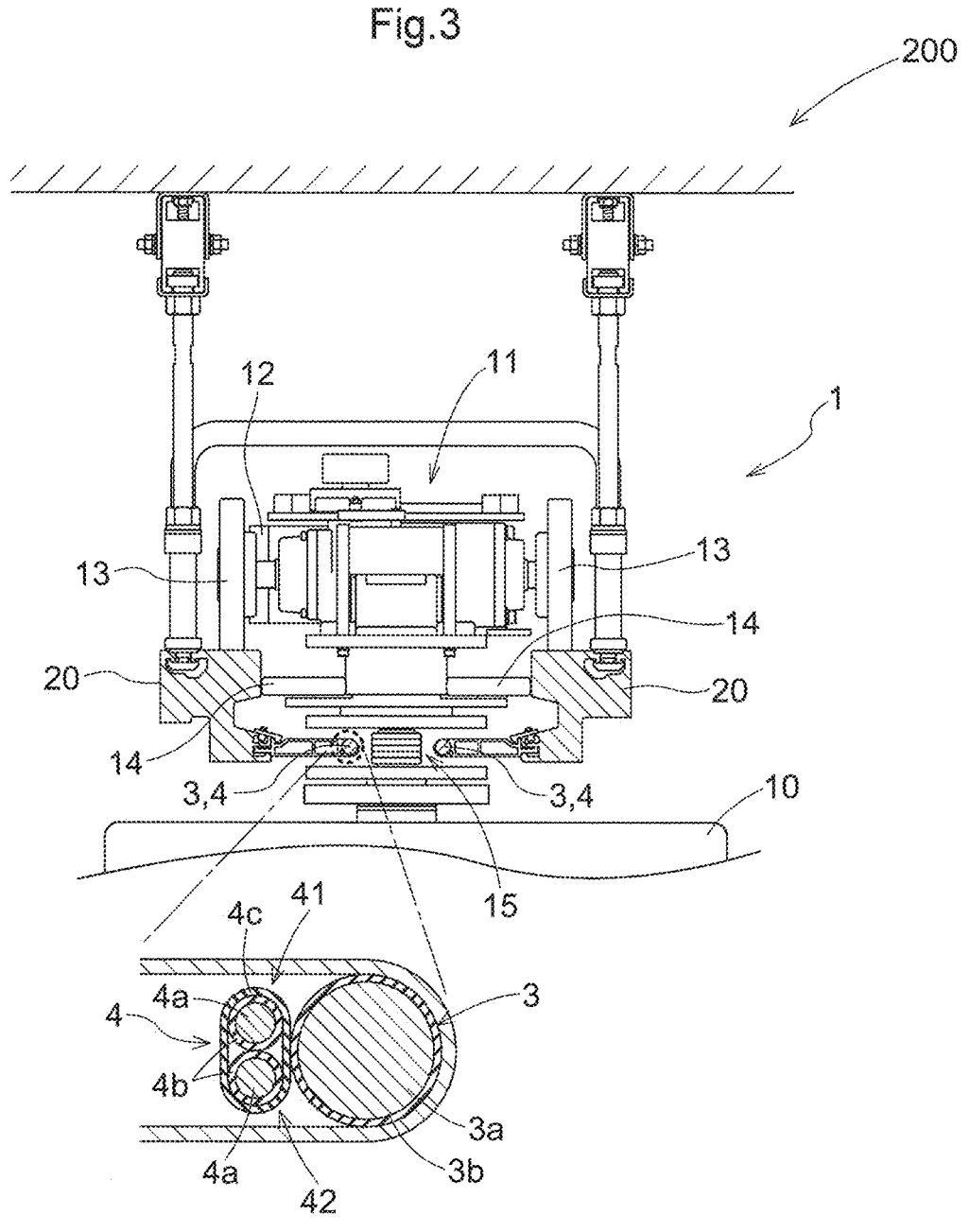
FIG. 3 is a diagram of an example movable body.

The movement path 2 may be defined physically or virtually. In FIG. 3, the movement path 2 is defined physically with a pair of rails 20 (a pair of horizontally spaced rails 20 in this example). When the movement path 2 is defined virtually, the movement path 2 is defined with, for example, a two-dimensional code or a radio frequency (RF) tag installed on the floor surface.

The movable body 1 illustrated in FIG. 3 has the structure described below. The movable body 1 includes a traveler 11 that travels along the movement path 2 (the rails 20 in this example) and a body 10 connected to the traveler 11. The articles contained in the body 10 are transported by the movable body 1. The traveler 11 includes travel wheels 13 that roll on traveling surfaces (upper surfaces in this example) of the rails 20, and a travel driver 12 (e.g., an electric motor such as a servo motor) that rotates the travel wheels 13. When the travel wheels 13 are driven by the travel driver 12 to rotate, the traveler 11 travels along the rails 20. The traveler 11 further includes guide wheels 14 that roll on guide surfaces (side surfaces in this example) of the rails 20. The traveler 11 travels along the rails 20 with the guide wheels 14 in contact with and guided along the guide surfaces of the rails 20.

In the example shown in FIG. 3, the movable body 1 is a ceiling-hung transport vehicle that travels along the rails 20 hung from and supported by the ceiling. However, the movable body 1 may be of another type. The movable body 1 may be, for example, a tracked carriage that travels along rails on the floor surface, a traveling carriage (shuttle carriage) that travels along rails arranged for the respective multiple shelves for storing articles, or a traveling carriage for a stacker crane.

Figure 2:
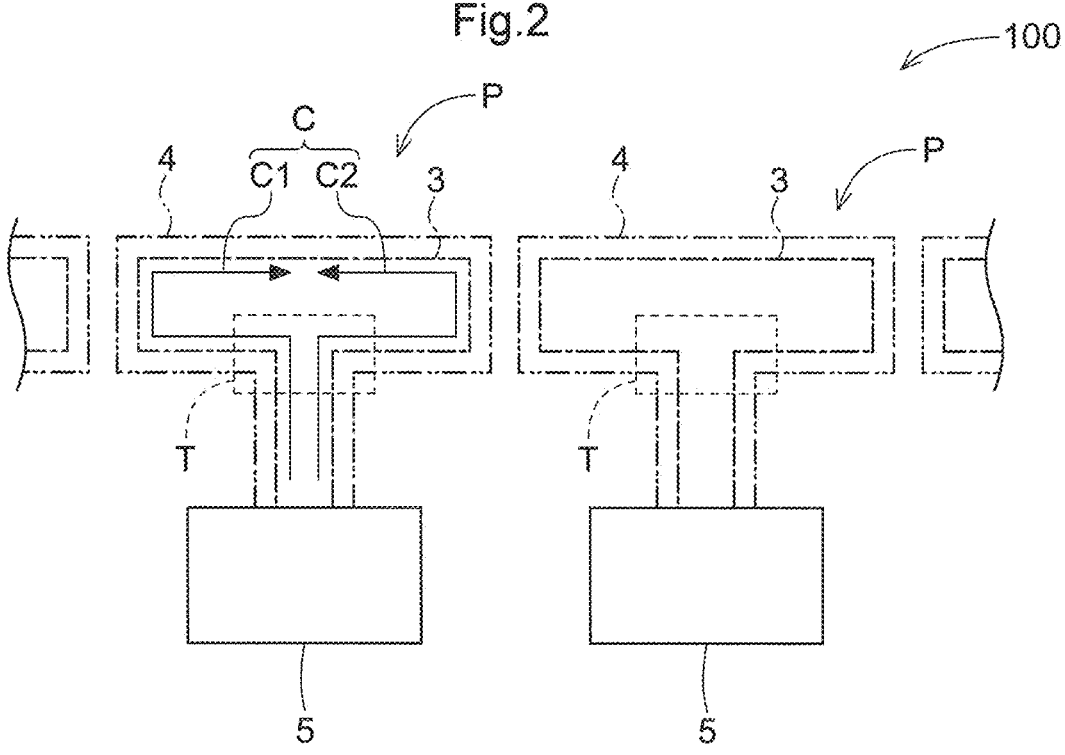
FIG. 2 is a schematic diagram of a power feeder.

As shown in FIGS. 2 and 3, the power feeder 100 includes feed lines 3 and power supplies 5 each connected to the feed lines 3. Each power supply 5 feeds power to the feed lines 3. The power supply 5 is, for example, a power supply panel incorporating a device for supplying power. The power supply 5 feeds alternating current (AC) to the feed lines 3. The power supply includes a power supply circuit such as a switching power supply circuit, including an inverter circuit. The power supply 5 causes, for example, the power supply circuit to output AC through pulse width modulation (PWM).

The feed lines 3 extend along the movement path 2 for the movable body 1. In the example shown in FIG. 3, the feed lines 3 extend along the rails 20 defining the movement path 2. The feed lines 3 feed power to a movable body 1. The feed lines 3 may feed power to the movable body 1 contactlessly or with contact. For example, power is fed to the movable body 1 from the feed lines 3 as induction lines when fed contactlessly, or power is fed to the movable body 1 from the feed lines 3 as trolley lines with contact. In the present embodiment, power is fed from the feed lines 3 to the movable body 1 contactlessly. In other words, the feed lines 3 feed power to the movable body 1 without contact. As shown in FIG. 3, each feed line 3 includes a conductive wire body 3a (core wire) formed from a conductor and a coating 3b formed from an insulator and covering the conductive wire body 3a. In the example in FIG. 3, the feed line 3 includes a single conductive wire with the conductive wire body 3a and the coating 3b. The feed line 3 may include a conductive wire bundle including multiple conductive wires each including the conductive wire body 3a and the coating 3b bundled together, and an insulation coating covering the conductive wire bundle.

Figure 6:
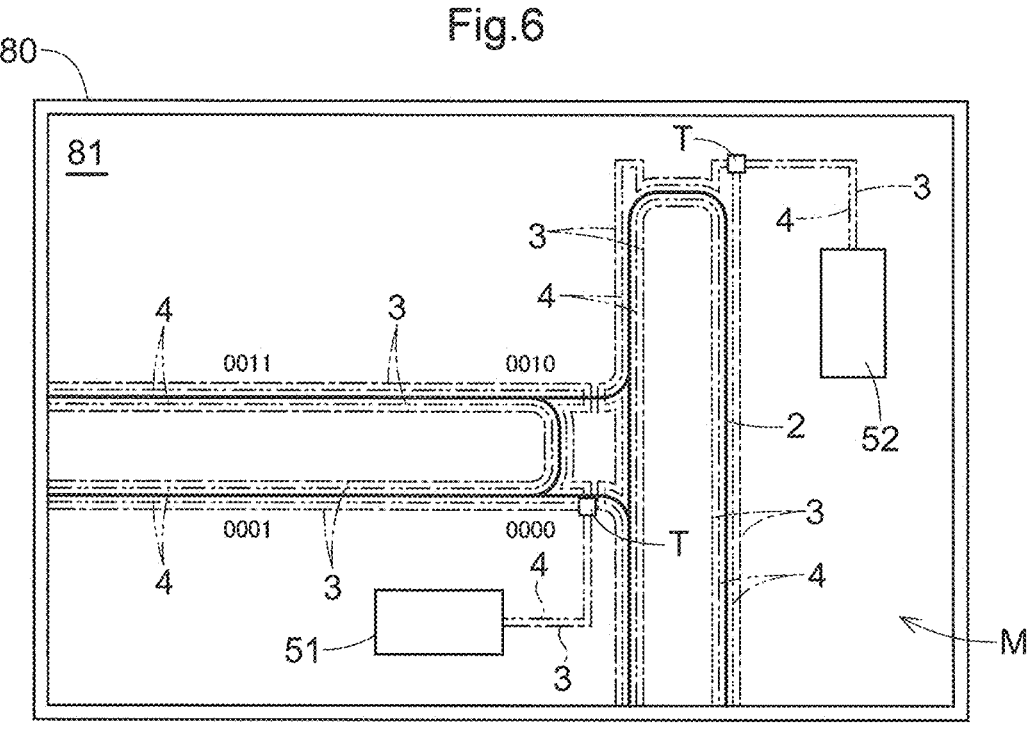
FIG. 6 is a diagram of an example display screen.

The movable body 1 includes a power receiver 15 that receives power supply from the feed lines 3. In the present embodiment, the power receiver 15 receives power from the feed lines 3 contactlessly. In the present embodiment, as shown in FIG. 3 and FIG. 6 (referred to later), two feed lines 3 extend along the movement path 2. The power receiver 15 between the two feed lines 3 receives power from the two feed lines 3 contactlessly. In the example shown in FIG. 3, a single feed line 3 extends along one of the pair of rails 20, and another feed line 3 extends along the other of the pair of rails 20.

As shown in a simplified manner in FIG. 2, each feed line 3 and each thermal line 4 (described later) extend from the corresponding power supply 5 along the movement path 2 and return to the power supply 5 (in other words, the same power supply 5). In other words, the feed line 3 and the thermal line 4 form a closed loop. In the present embodiment, as described above, the two feed lines 3 extend along the movement path 2 and form the same closed loop.

A single closed loop may be formed with a single continuous feed line 3 or with multiple feed lines 3 connected to one another through joints such as connectors or terminal blocks. Similarly, a single closed loop may be formed with a single continuous thermal line 4 or with multiple thermal lines 4 connected to one another through joints such as connectors or terminal blocks. A single continuous feed line 3 may have different portions each as a single feed line 3 in an extension direction (a direction in which the feed line 3 extends). For example, the two feed lines 3 extend along the movement path 2 as described above in the present embodiment. The two feed lines 3 may be connected to each other through a joint, or may each have different portions of a single continuous feed line 3 in the extension direction. Similarly, a single continuous thermal line 4 may include different portions each as a single thermal line 4 in an extension direction (a direction in which the thermal line 4 extends).

At least some of the movements of the movable body 1 (e.g., a movement along the movement path 2) are performed using power received by the power receiver 15. In other words, power received by the power receiver 15 is fed to an actuator (e.g., the travel driver 12 described above) to operate the movable body 1. The power receiver 15 includes, for example, a pickup coil. In the pickup coil, a magnetic field is generated around the feed lines 3 receiving AC. The magnetic field induces AC power. The AC power is converted to, for example, DC and fed to the actuator to operate the movable body 1.

In the present embodiment, as shown in FIG. 2, the power feeder 100 includes multiple power feeding units that are each a set of the feed lines 3 and the power supply 5 connected to the feed lines 3. In other words, the power feeder 100 includes multiple feed lines 3 and power supplies 5 connected to the corresponding feed lines 3. The multiple feed lines 3 herein are multiple feed lines 3 each extending from the corresponding power supply 5 along the movement path 2 and return to the power supply 5.

Each of the multiple power feeding units feeds power to the movable body 1 in the corresponding feeding area. Two power supplies 5 different from each other are used as a first power supply 51 and a second power supply 52. In FIG. 6, the area in which the feed lines 3 are connected to the first power supply 51 (excluding an area between the first power supply 51 and a terminal box T described later) is a feeding area in which power is fed from the first power supply 51. The area in which the feed lines 3 are connected to the second power supply 52 (excluding an area between the second power supply 52 and the terminal box T described later) is a feeding area in which power is fed from the second power supply 52. For the movable body 1 to receive power at a joint between the feeding areas, the multiple power supplies 5 are controlled to cause their AC with the same phase to flow through the two feed lines 3 at the joint, although this is not described in detail.

The power feeder 100 includes, in addition to the feed lines 3, the thermal lines 4 (heat-sensitive line) extending along the feed lines 3. The thermal lines 4 extend along the movement path 2 together with the feed lines 3. The power feeder 100 in the present embodiment includes multiple feed lines 3 and the thermal lines 4 extending along the respective feed lines 3.

As shown in FIG. 3, each thermal line 4 includes a pair of conductive wires, or a first conductive wire 41 and a second conductive wire 42. Each of the first conductive wire 41 and the second conductive wire 42 is coated with an insulator 4b including a core wire 4a formed from a conductor. The core wire 4a softens at a predetermined temperature. The first conductive wire 41 and the second conductive wire 42 in the pair are twisted into a twisted pair. The twisted conductive wires are further covered with a cover 4c to form the thermal line 4. When the insulator 4b softens, the core wire 4a in the first conductive wire 41 and the core wire 4a in the second conductive wire 42 come in contact with each other, causing short-circuiting on the thermal line 4. Although the insulator 4b softens, the first conductive wire 41 and the second conductive wire 42 are covered with the cover 4c. This reduces the exposure of the core wire 4a outside.

The thermal lines 4 extend along the feed lines 3 to detect abnormal heat generation in and around the feed lines 3. In the example shown in FIG. 3, each thermal line 4 is adjacent to the corresponding feed line 3 (in contact with the corresponding feed line 3 from outside in this example). When each feed line 3 includes a conductive wire bundle and an insulation coating covering the conductive wire bundle as described above, the corresponding thermal line 4 may be contained under the insulation coating. In this case, the thermal line 4 is, for example, surrounded by multiple conductive wires included in the conductive wire bundle at the center of the feed line 3.

The power feeder 100 includes an abnormality detector 6 that detects an abnormality on the thermal line 4. In response to the abnormality detector 6 detecting an abnormality on the thermal line 4, abnormality control for removing the abnormality on the thermal line 4 is performed by, for example, a controller 7 (described later). The abnormality control is, for example, control to stop the power supply to the feed lines 3 from the power supply 5.

Abnormalities on the thermal line 4 detected by the abnormality detector 6 include short-circuiting on the thermal line 4 caused by heat generation. For example, abnormal heat generation in and around the feed line 3 causes short-circuiting on the thermal line 4. Example causes of abnormal heat generation of the feed line 3 include temperature increase in the feed line 3 caused by an overcurrent or short-circuiting caused by an overload. Example causes of abnormal heat generation around the feed line 3 include a temperature increase caused by a magnetic field generated around the feed line 3 by metal around the feed line 3 (e.g., a metal tool accidentally misplaced by an operator). Such abnormalities on the thermal line 4 detected by the abnormality detector 6 may include, in addition to short-circuiting on the thermal line 4, a disconnected thermal line 4 caused by faulty installation or aging.

Figure 4:
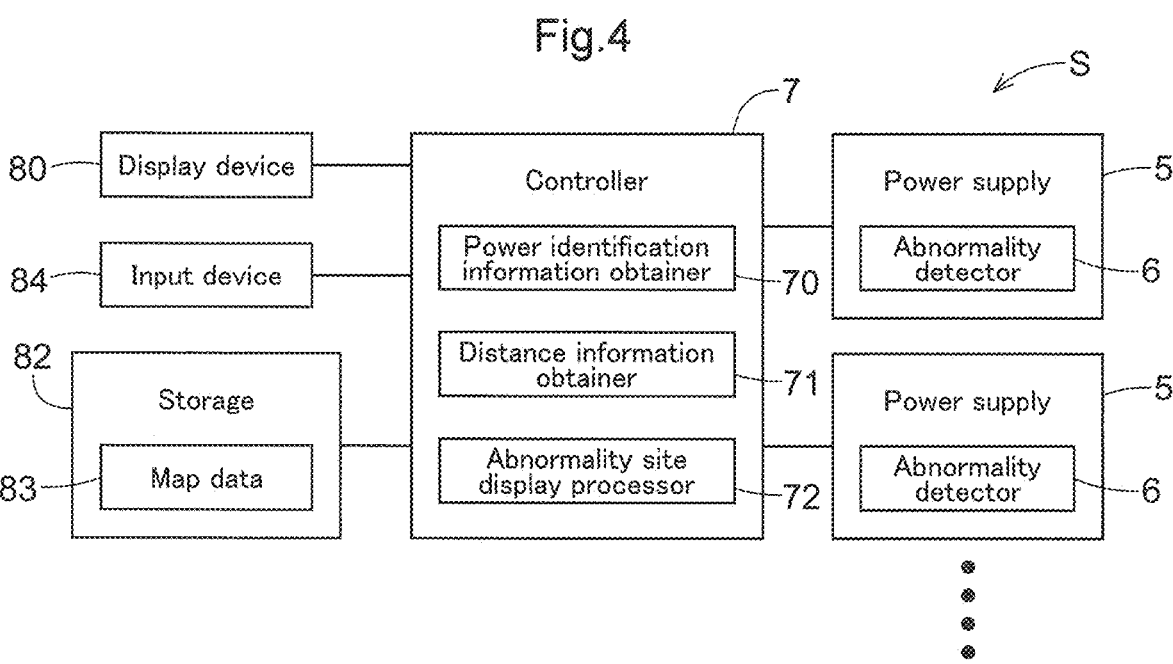
FIG. 4 is a control block diagram.
Figure 5:
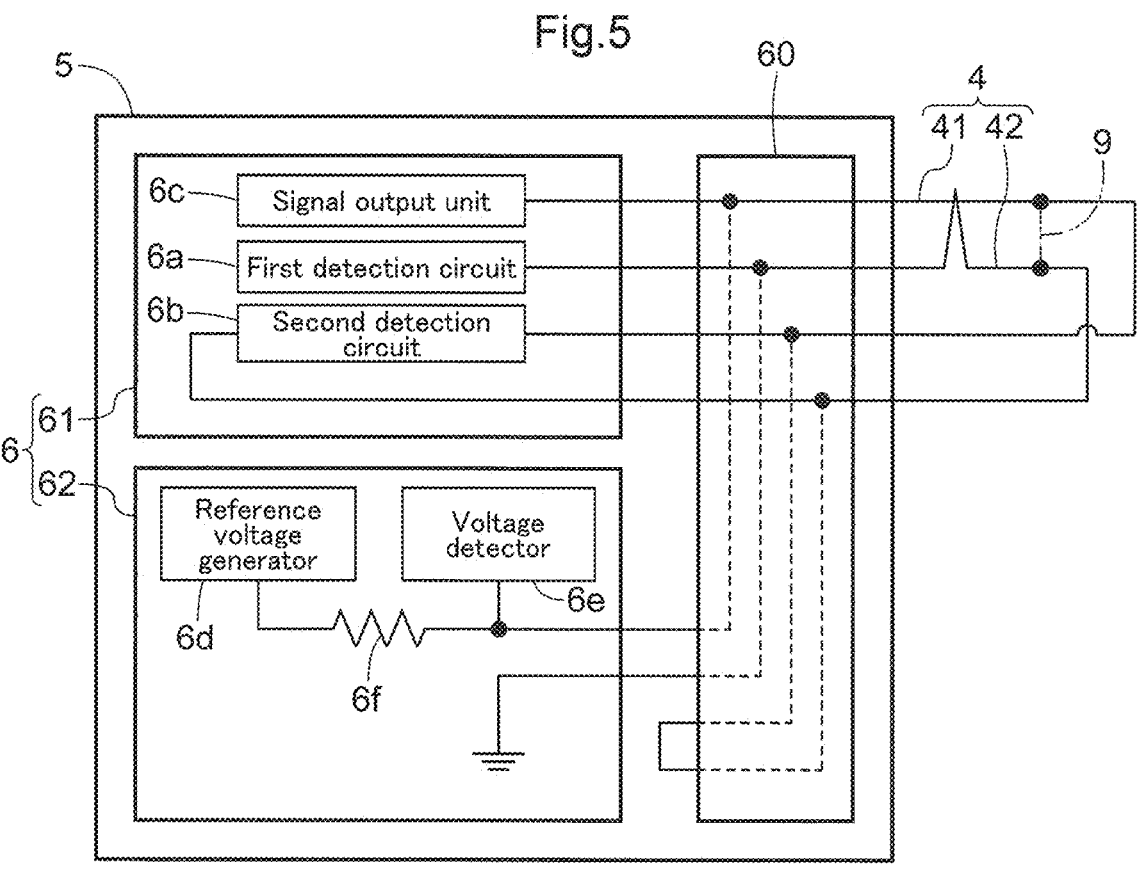
FIG. 5 is a block diagram of an example abnormality detector.

As shown in FIG. 4, the abnormality detector 6 in the present embodiment is disposed in each power supply 5. More specifically, as shown in FIG. 5, the abnormality detector 6 includes a first substrate 61 incorporated in the power supply 5. The first substrate 61 is a thermal line substrate for detecting an abnormality on the thermal line 4. The abnormality detector 6 further includes a second substrate 62 incorporated in the power supply 5. The second substrate 62 is an abnormality site locating substrate for locating an abnormality site 9 on the thermal line 4.

The connection state between the abnormality detector 6 and the thermal line 4 is switched by a switching device 60, such as a relay, between a first connection state in which the first substrate 61 is connected to the thermal line 4 (indicated by the solid lines in FIG. 5), and a second connection state in which the second substrate 62 is connected to the thermal line 4 (indicated by the broken lines in FIG. 5). The connection state between the abnormality detector 6 and the thermal line 4 is set to the first connection state during a normal operation, and is switched to the second connection state when an abnormality on the thermal line 4 is detected by the abnormality detector 6 (specifically, the first substrate 61).

In the example shown in FIG. 5, the first substrate 61 includes a signal output unit 6c, a first detection circuit 6a, and a second detection circuit 6b. In the first connection state described above, a first end of the thermal line 4 is connected to the signal output unit 6c and the first detection circuit 6a, and a second end of the thermal line 4 is connected to the second detection circuit 6b. More specifically, a first end of the first conductive wire 41 is connected to the signal output unit 6c, a first end of the second conductive wire 42 is connected to the first detection circuit 6a, and second ends of the first conductive wire 41 and the second conductive wire 42 are connected to the second detection circuit 6b.

The signal output unit 6c includes a circuit (e.g., a DC-DC converter) included in a power supply, and feeds power to the first conductive wire 41 and the second conductive wire 42. The first detection circuit 6a monitors the current flowing through the first end of the second conductive wire 42. The second detection circuit 6b monitors the current flowing through a joint between the second end of the first conductive wire 41 and the second end of the second conductive wire 42. The first detection circuit 6a and the second detection circuit 6b each include, for example, a mechanical relay including a coil and a contact. The first detection circuit 6a and the second detection circuit 6b determine that a signal is detected when a current (e.g., a current sufficient to close the contact in the relay; the same applies hereafter)

is flowing through the monitored area of the corresponding current, and determine that no signal is detected when no current is flowing through the monitored area of the corresponding current.

When the thermal line 4 is normal, the first detection circuit 6a and the second detection circuit 6b both determine that a signal is detected. In contrast, when the thermal line 4 is short-circuited, the first detection circuit 6a determines that a signal is detected, but the second detection circuit 6b determines that no signal is detected. A similar determination result is obtained when the thermal line 4 is disconnected at a position closer to the second end (the end connected to the second detection circuit 6b) than the short-circuited site. When the thermal line 4 is disconnected, the first detection circuit 6a and the second detection circuit 6b both determine that no signal is detected. A similar determination result is obtained when the thermal line 4 is short-circuited at a position closer to the second end than the disconnection site.

The abnormality detector 6 (specifically, an arithmetic processor in the abnormality detector 6) determines that the thermal line 4 is abnormal (specifically, short-circuiting) when the state changes from the first detection circuit 6a and the second detection circuit 6b both detecting a signal to the first detection circuit 6a detecting a signal and the second detection circuit 6b detecting no signal. The abnormality detector 6 also determines that the thermal line 4 is abnormal (specifically, disconnection) when the state changes from the first detection circuit 6a and the second detection circuit 6b both detecting a signal changes to the first detection circuit 6a and the second detection circuit 6b both detecting no signal.

The first substrate 61 may not include the first detection circuit 6a. In this case, the abnormality detector 6 determines that the thermal line 4 is abnormal when the state changes from the second detection circuit 6b detecting a signal to the second detection circuit 6b detecting no signal. An abnormality on the thermal line 4 is detected without being distinguished between short-circuiting and disconnection.

In the example shown in FIG. 5, the second substrate 62 includes a reference voltage generator 6d, a voltage detector 6e, and a resistance 6f. In the second connection state described above, the first conductive wire 41 has the first end connected to the reference voltage generator 6d through the resistance 6f, the second conductive wire 42 has the first end grounded, and the first conductive wire 41 has the second end connected to the second end of the second conductive wire 42. The voltage detector 6e detects a voltage between the resistance 6f and the first end of the first conductive wire 41.

A reference voltage generated by the reference voltage generator 6d is divided by the resistance 6f and the conductor resistance of the thermal line 4. The conductor resistance of the thermal line 4 changes based on the abnormality site 9 (specifically, the short-circuited site). More specifically, the conductor resistance of the thermal line 4 increases as the distance between the first end of the thermal line 4 (the end connected to the reference voltage generator 6d) and the abnormality site 9 increases. Thus, the distance from the abnormality detector 6 to the abnormality site 9 (in the present embodiment, the same as the distance from the power supply 5 to the abnormality site 9) can be estimated based on a value detected by the voltage detector 6e with respect to the reference voltage. The abnormality detector 6 thus estimates the distance to the abnormality site 9 using the conductor resistance of the thermal line 4 changing based on the abnormality site 9 (specifically, the short-circuited site). The method for estimating the distance to the abnormality site 9 described above is a mere example, and other estimation methods may also be used.

An abnormality locating system S according to the present embodiment will now be described. As shown in FIG. 4, the abnormality locating system S includes a display device 80 that displays information, a controller 7 that controls the display device 80, and a storage 82 that stores map data 83 about the power feeder 100. In the present embodiment, the controller 7 also controls the power supplies 5. The controller 7 may be a device separate from the device that controls the power supplies 5. In this case, the controller 7 may not communicate with the power supplies 5. The abnormality locating system S further includes an input device 84. The functions of the controller 7 are implemented by, for example, hardware including an arithmetic processor cooperating with a program executed on the hardware.

The devices shown in FIG. 4 are at least conceptually distinguishable from one another, and two or more of the devices (e.g., the controller 7 and the power supply 5) may be included in a common device, or any of the devices may include multiple devices. The functional components of the controller 7 are at least logically distinguishable from one another, and may not be physically separate from one another. At least some of the functions of the abnormality detector 6 (e.g., the function to determine an abnormality on the thermal line 4 or the function to estimate the distance to the abnormality site 9) may be implemented by the controller 7.

The controller 7 generates a display image to be displayed on a display screen 81 (refer to FIGS. 6 to 8) of the display device 80 and controls the display device 80 to display the display image on the display screen 81. The display device 80 may be, for example, a liquid crystal display or an organic electroluminescent (EL) display. In the example in FIGS. 6 to 8, the display screen 81 is disposed on the outer surface of the display device 80. The display screen 81 may be projected onto, for example, a projection surface.

The controller 7 obtains operation information representing the details of operations (e.g., numerical input operations and screen operations) performed on the input device 84 by the operator. The controller 7 generates, for example, a display image corresponding to the details of the screen operation. Examples of the input device 84 include a keyboard and a pointing device (e.g., a mouse, a touchpad, or a touchscreen). The display device 80 may be integral with the input device 84, or for example, may be a device with the display screen 81 functioning as a touchscreen.

The storage 82 includes a storage medium that stores or rewrites information. The controller 7 refers to the storage 82 and obtains information stored in the storage 82 (e.g., information included in the map data 83). Examples of the storage 82 include a flash memory and a hard disk drive. The storage 82 may be disposed on a server or a cloud server that can communicate with the controller 7.

The map data 83 stored in the storage 82 includes power supply positioning information indicating the positions of the power supplies 5, feed line positioning information indicating the positions of the feed lines 3 connected to the respective power supplies 5, and thermal line positioning information indicating the positions of the thermal lines 4 extending along the corresponding feed lines 3. The map data 83 may further include other information used to display a map M (described later). Examples of the other information include layout information about the movement path 2 or address information set for the movement path 2.

In the present embodiment, the power feeder 100 includes multiple feed lines 3 and multiple power supplies 5. Thus, the power supply positioning information included in the map data 83 indicates the positions of the multiple power supplies 5. The feed line positioning information included in the map data 83 indicates the positions of the feed lines 3 connected to the respective power supplies 5. The thermal line positioning information indicates the positions of the thermal lines 4 extending along the corresponding feed lines 3.

The controller 7 includes a distance information obtainer 71 and an abnormality site display processor 72. In the present embodiment, the controller 7 further includes a power identification information obtainer 70.

The distance information obtainer 71 is a functional component that obtains distance information indicating the distance from a power supply 5 (specifically, a target power supply described later) to an abnormality site on the thermal line 4 in response to the abnormality detector 6 detecting an abnormality on the thermal line 4. In the present embodiment, the distance information obtainer 71 obtains a distance value input by the operator using the input device 84 as the distance information. For example, a distance value to the abnormality site 9 estimated by the abnormality detector 6 (specifically, the second substrate 62) is displayed on a display of the power supply 5. The operator then inputs the displayed value using the input device 84. The distance value on the display of the power supply 5 may be zero when, for example, an abnormality has occurred in the power supply 5. This structure easily allows an abnormality on the thermal line 4 to be distinguished from an abnormality on the power supply 5. In place of the structure in which the operator inputs a distance value as described above, for example, the distance information obtainer 71 may obtain a distance value to the abnormality site 9 estimated by the abnormality detector 6 as the distance information through communication between the controller 7 and the abnormality detector 6 or between the controller 7 and the power supply 5.

For the abnormality detector 6 disposed differently from the power supply 5, for example, when a distance value input into the controller 7 by the operator or through the communication indicates a distance value from a base position different from the power supply 5 to the abnormality site 9, the distance information obtainer 71 obtains the distance value from the power supply 5 to the abnormality site 9 using calculation based on the distance value input into the controller 7 (e.g., adding the distance value between the power supply 5 and the base position).

The power identification information obtainer 70 is a functional component that obtains power identification information for identifying a target power supply as a power supply 5 connected to the feed lines 3 along which an abnormal thermal line 4 extends. In the present embodiment, the operator specifies the power supply 5 using the input device 84, and the power identification information obtainer 70 obtains information identifying the power supply 5 specified by the operator as the power identification information. With an abnormality report as a warning sound, warning light, or a screen display, for example, the operator identifies the power supply 5 connected to the feed lines 3 along which the abnormal thermal line 4 extends (in other words, the power supply 5 to which the abnormal thermal line 4 is connected) and specifies the identified power supply 5 using the input device 84. The operator specifies the power supply 5 by, for example, selecting the power supply 5 on the map M (described later) with a click operation or by inputting a number identifying the power supply 5. In place of the above structure, for example, the power identification information obtainer 70 may obtain the power identification information through communication between the controller 7 and the abnormality detector 6 or between the controller 7 and the power supply 5.

The abnormality site display processor 72 is a functional component that performs an abnormality site estimation process and a display process. In the abnormality site estimation process, the abnormality site display processor 72 estimates the abnormality site 9 on a thermal line 4 based on the distance information. In the abnormality site estimation process in the present embodiment, the abnormality site display processor 72 estimates the abnormality site 9 based on the distance information and the power identification information. In the display process, the abnormality site display processor 72 causes the display device 80 to display the map M indicating the positions of the thermal lines 4 based on the map data 83 and to display, on the map M, an estimated position E of the abnormality site 9 estimated through the abnormality site estimation process.

FIG. 6 shows the map M being displayed on the display screen 81 through the display process. FIG. 6 shows the map M showing the thermal lines 4 in an area of the layout of the movement path 2 (refer to FIG. 1). The map M further shows the movement path 2, the feed lines 3, the power supplies 5, terminal boxes T (described later), and the addresses of the movement path 2 (numerical values such as 0000 in this example). This map shows two power supplies 5, or the first power supply 51 and the second power supply 52, the feed lines 3 connected to the first power supply 51, the thermal lines 4 extending along the feed lines 3 (the thermal lines 4 connected to the first power supply 51), the feed lines 3 connected to the second power supply 52, and the thermal lines 4 extending along the feed lines 3 (the thermal lines 4 connected to the second power supply 52). For example, the power supplies 5, the area between the power supply 5 and the terminal box T in the feed line 3, and the area between the power supply 5 and the terminal box T in the thermal line 4 may be displayed at positions different from the actual positions on the map M for ease of viewing.

In the present embodiment, as shown in a simplified manner in FIG. 2, each feed line 3 and each thermal line 4 extend from the corresponding power supply 5 and return to the power supply 5 (in other words, the same power supply 5), and thus are included in a circulation path P. One side along a circulation direction of the circulation path P is a first side C1, and the side opposite to the first side C1 is a second side C2. In the present embodiment, the power feeder 100 includes the terminal boxes T. The feed line 3 includes a first portion extending from the power supply 5 to the terminal box T on the first side C1 and a second portion extending from the power supply 5 to the terminal box T on the second side C2. The first portion and the second position are adjacent to each other to reduce the likelihood of generating a magnetic field in the surrounding environment (in other words, to form a non-inductive line). In the example shown in FIG. 6, a single line segment indicates the portion between the power supply 5 and the terminal box T in the feed line 3. In the example shown in FIG. 6, a single line segment indicates the portion between the power supply 5 and the terminal box T in the thermal line 4 as well.

Figure 7:
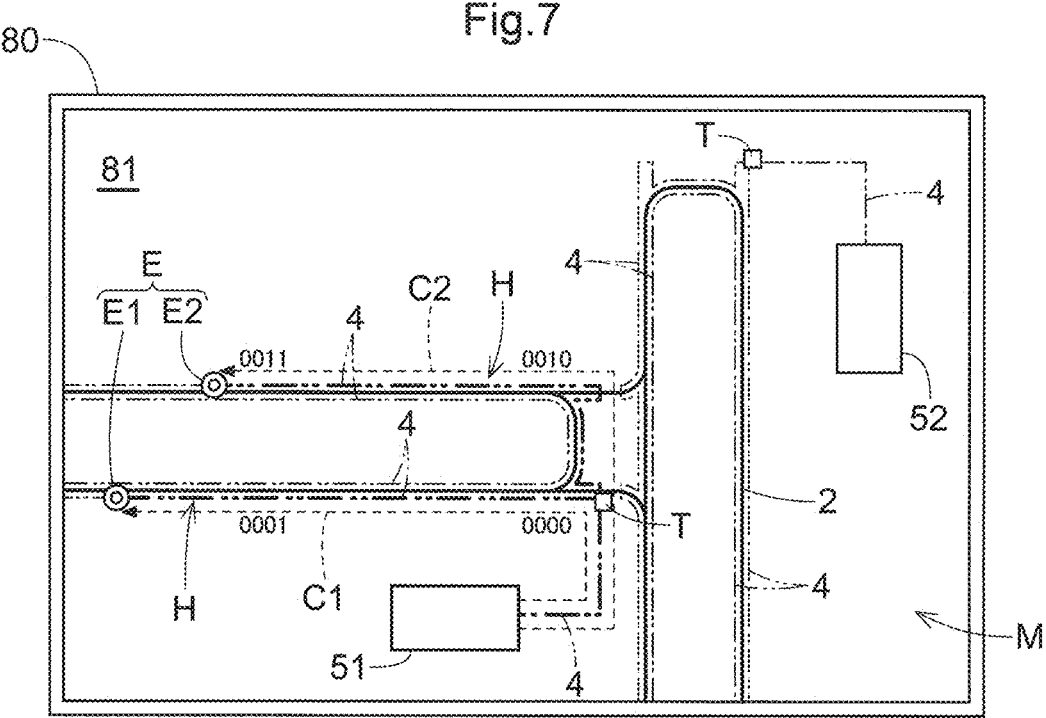
FIG. 7 is a diagram of another example display screen.

In the abnormality site estimation process, the abnormality site display processor 72 estimates, as the abnormality site 9, a position away from the power supply 5 (specifically, the target power supply; the same applies hereafter) by the distance indicated by the distance information (distance information obtained by the distance information obtainer 71) along the thermal line 4. More specifically, in the abnormality site estimation process, the abnormality site display processor 72 estimates a first position E1 and a second position E2 each as the abnormality site 9. The first position E1 is away from the power supply 5 by the distance indicated by the distance information on the first side C1 along the circulation path P (circulation path P including the thermal line 4; the same applies hereafter). The second position E2 is away from the power supply 5 by the distance indicated by the distance information on the second side C2 along the circulation path P. As shown in FIG. 7, the abnormality site display processor 72 causes each of the first position E1 and the second position E2 to be displayed on the map M as an estimated position E of the abnormality site 9 in the display process. Unlike in FIG. 6, the feed lines 3 are not shown in FIG. 7.

In FIG. 7, the target power supply (the power supply 5 connected to the feed lines 3 along which an abnormal thermal line 4 extends) is the first power supply 51. In FIG. 7, two estimated positions E, or the first position E1 and the second position E2 are shown on the map M. The first position E1 is away from the first power supply 51 by the distance indicated by the distance information on the first side C1 along the circulation path P. The second position E2 is away from the first power supply 51 by the distance indicated by the distance information on the second side C2 along the circulation path P. The estimated positions E are indicated by double circles.

In the display process, the abnormality site display processor 72 may highlight a path of the thermal line 4 from the power supply 5 (specifically, the target power supply) to each estimated position E of the abnormality site 9 over a path of the other portion of the thermal line 4. For example, using different colors (e.g., tone or brightness), different thicknesses, different shapes (e.g., a solid line, a dashed line, and a dot-dash line), or a combination of these, the path of the thermal line 4 from the power supply 5 to the estimated position E of the abnormality site 9 can be highlighted over a path of the other portion of the thermal line 4. In the example shown in FIG. 7, as indicated by the reference letters H, both the path of the thermal line 4 from the first power supply 51 to the first position E1 and the path of the thermal line 4 from the first power supply 51 to the second position E2 are thicker than the path of the other portion of the thermal line 4. In FIG. 7, both the first position E1 and the second position E2 are highlighted, but either the first position E1 or the second position E2 (e.g., the one selected by the operator) may be highlighted alone.

For example, the abnormality locating system S with the structure described below allows the path of the thermal line 4 from the power supply 5 to the estimated position E of the abnormality site 9 to be easily identified. The controller 7 is designed to receive an abnormality site display operation to cause displaying of the abnormality site 9. When the abnormality site display operation is yet to be received, the abnormality site display processor 72 causes, in the display process, the display device 80 to display both the power supply 5 (specifically, the target power supply; the same applies hereafter) and the estimated position E of the abnormality site 9 or to display the entire path of the thermal line 4 from the power supply 5 to the estimated position E of the abnormality site 9 on the map M. In the example shown in FIG. 7, the entire path of the thermal line 4 from the power supply 5 to the estimated position E of the abnormality site 9 (both the first position E1 and the second position E2 in this example) is displayed on the map M.

When the abnormality site display operation is received, the abnormality site display processor 72 causes, in the display process, the display device 80 to display the map M indicating the area around the estimated position E of the abnormality site 9. More specifically, when an operation of selecting the first position E1 (e.g., a click operation using the input device 84) is received as an abnormality site display operation, the map M indicating the area around the first position E1 is displayed. When an operation of selecting the second position E2 is received as an abnormality site display operation, the map M indicating the area around the second position E2 is displayed, as in the example shown in FIG. 8(d). When the map M indicating the area around the estimated position E of the abnormality site 9 is displayed on the display device 80, the area around the estimated position E of the abnormality site 9 may be enlarged more than in the normal display process (refer to FIG. 7, in which the abnormality site display process is not received), as in the example shown in FIG. 8(d).

The abnormality locating system S having the structure described below in addition to or in place of the above structure still allows the path of the thermal line 4 from the power supply to the estimated position E of the abnormality site 9 to be easily identified. The controller 7 is designed to receive a video reproduction request operation. The video reproduction request operation is, for example, a click operation on a button image representing video reproduction using the input device 84. When the video reproduction request operation is received, the abnormality site display processor 72 performs, in the display process, a video reproduction process of displaying the map M while moving a base position A of the map M displayed on the display device 80 along the path of the thermal line 4 from the power supply 5 (specifically, the target power supply) to the estimated position E of the abnormality site 9. In FIGS. 8(a) to 8(d), the maps M displayed when a video reproduction request operation is performed for the second position E2 (refer to FIG. 7) are shown in chronological order of FIGS. 8(a), 8(b), 8(c), and 8(d). The base position A is indicated by the double circle in the same manner as the estimated position E in each figure.

In the examples shown in FIGS. 8(a) to 8(d), each map M shows the base position A at the center of the display area of the map M (the entire display screen 81 in this example). The map M may show the base position A at a position different from the center of the display area of the map M. For example, when the base position A is close to the edge of the layout of the movement path 2 and an object to be displayed (a display target) is not in one of areas adjacent to the base position A, the map M may show the base position A displaced from the center position toward the area with no display target. In this case, the map M displayed may have a wider display area opposite to the area with no display target.

OTHER EMBODIMENTS (1) In the above embodiment, in the abnormality site estimation process, the abnormality site display processor 72 estimates the first position E1 and the second position E2 each as the abnormality site 9. The first position E1 is away from the power supply 5 by the distance indicated by the distance information on the first side C1 along the circulation path P. The second position E2 is away from the power supply 5 by the distance indicated by the distance information on the second side C2 along the circulation path P. The disclosure is not limited to this structure. When the estimated position E can be narrowed down to either the first position E1 or the second position E2, only one of the first position E1 or the second position E2 may be estimated as the abnormality site 9. For example, when a side away from the joint with the second substrate 62 (specifically, the reference voltage generator 6d; refer to FIG. 5) along the circulation path P can be identified as the first side C1, only the first position E1 can be estimated as the abnormality site 9. Additionally, when, for example, a side away from the joint with the second substrate 62 along the circulation path P can be identified as the second side C2, only the second position E2 can be estimated as the abnormality site 9.

(2) In the above embodiment, the power feeder 100 includes multiple power feeding units that are sets of the feed lines 3 and the power supply 5 connected to the feed lines 3. The disclosure is not limited to this structure. The power feeder 100 may include a single power feeding unit. In this case, unlike in the above embodiment, the controller 7 may not include the power identification information obtainer 70.

(3) The structure described in each of the above embodiments may be combined with any other structures described in the other embodiments unless any contradiction arises. This also applies to combinations of the embodiments described as other embodiments. For other structures as well, the embodiments described herein are merely illustrative in all aspects. Thus, the embodiments described herein may be modified variously as appropriate without departing from the spirit and scope of the disclosure.

Overview of Embodiment

The abnormality locating system described above will be overviewed below.

The abnormality locating system is a system for locating an abnormality of a thermal line in a power feeder. The power feeder includes a feed line extending along a movement path of a movable body to feed power to the movable body, a power supply connected to the feed line to feed power to the feed line, the thermal line extending along the feed line, and an abnormality detector to detect an abnormality of the thermal line. The system includes a display device that displays information, a controller that controls the display device, and a storage storing map data of the power feeder. The map data includes power supply positioning information indicating a position of the power supply, feed line positioning information indicating a position of the feed line connected to the power supply, and thermal line positioning information indicating a position of the thermal line along the feed line. The controller includes a distance information obtainer and an abnormality site display processor. The distance information obtainer, in response to the abnormality detector detecting an abnormality of the thermal line, obtains distance information indicating the distance from the power supply to a location of the abnormality. The abnormality site display processor performs an abnormality site estimation process of estimating a location of an abnormality site based on the distance information, the abnormality site being a site of the abnormality of the thermal line, and a display process of causing the display device to display a map indicating the position of the thermal line based on the map data and to display, on the map, an estimated position of the abnormality site estimated through the abnormality site estimation process.

With the structure according to the above aspect, when an abnormality, such as short-circuiting or disconnection, is detected on the thermal line, the estimated position of the abnormality site can be displayed on a map indicating the layout of the thermal line (specifically, on a wiring layout of the thermal line) displayed on the display device. The operator can thus easily determine the estimated position of the abnormality site on the wiring layout of the thermal line based on the information displayed on the display device. This allows the operator to easily determine the abnormality site on the thermal line in the power feeder when, for example, the operator goes to the abnormality site for inspection or repair.

As described above, this structure allows the operator to easily determine the estimated position of the abnormality site on the wiring layout of the thermal line.

The feed line and the thermal line may extend from the power supply along the movement path and return to the power supply. In the abnormality site estimation process, the abnormality site display processor may estimate, as the location of the abnormality site, a position away from the power supply by a distance indicated by the distance information along the thermal line.

In this structure, when an abnormality on the thermal line is detected, an estimated position of the abnormality site displayed on the display device can be estimated with high accuracy.

In the structure in which the abnormality site is estimated as described above, the thermal line may be included in a circulation path extending from the power supply and returning to the power supply. In the abnormality site estimation process, the abnormality site display processor may estimate a first position and a second position each as the location of the abnormality site. The first position may be away from the power supply by the distance indicated by the distance information along the circulation path on a first side in a circulation direction of the circulation path. The second position may be away from the power supply by the distance indicated by the distance information along the circulation path in on a second side in the circulation path. The second side may be opposite to the first side. In the display process, the abnormality site display processor may cause each of the first position and the second position to be displayed on the map as the estimated position of the abnormality site.

In this structure, when the thermal line is included in the circulation path, two positions are away from the power supply by the same distance along the thermal line. The display device may thus display the two positions as candidates for the estimated position of the abnormality site on the wiring layout of the thermal line.

In the abnormality locating system with each structure described above, the controller may be configured to receive an abnormality site display operation to cause displaying of the abnormality site. When the abnormality site display operation is yet to be received, the abnormality site display processor may cause, in the display process, the display device to display both the power supply and the estimated position of the abnormality site on the map or to display an entire path of a portion of the thermal line which portion extends from the power supply to the estimated position of the abnormality site on the map. In response to the controller receiving the abnormality site display operation, the abnormality site display processor may cause, in the display process, the display device to display a portion of the map which portion indicates an area around the estimated position of the abnormality site.

In this structure, the operator can easily determine the positional relationship between the power supply and the abnormality site with both the power supply and the estimated position of the abnormality site being displayed on the map, or with the entire path of the thermal line from the power supply to the estimated position of the abnormality site being displayed on the map. The operator can also easily determine the structure of the power feeder around the abnormality site by performing the abnormality site display operation for causing the display device to display the map indicating the area around the estimated position of the abnormality site.

In the display process, the abnormality site display processor may highlight a path of a first portion of the thermal line which first portion extends from the power supply to the estimated position of the abnormality site over a path of a second portion of the other portion of the thermal line.

This structure allows the display device to display information that allows the operator to easily identify the path of the thermal line from the power supply to the estimated position of the abnormality site.

The controller may be configured to receive a video reproduction request operation. In response to the controller receiving the video reproduction request operation, the abnormality site display processor may perform, in the display process, a video reproduction process of causing the display device to display the map while moving a base position over the map displayed on the display device along a path of a portion of the thermal line which portion extends from the power supply to the estimated position of the abnormality site.

This structure allows the display device to display information that allows the operator to easily identify the direction, as well as the shape, of the path of the thermal line from the power supply to the estimated position of the abnormality site.

The abnormality locating system according to one or more embodiments of the disclosure may produce at least one of the effects described above.

What is claimed is:

1. An abnormality locating system for locating an abnormality of a thermal line in a power feeder, the power feeder comprising a feed line extending along a movement path of a movable body to feed power to the movable body, a power supply connected to the feed line to feed power to the feed line, the thermal line extending along the feed line, and an abnormality detector to detect an abnormality of the thermal line, the system comprising:

a display device configured to display information;
a controller configured to control the display device; and
a storage unit storing map data of the power feeder, and wherein:
the map data includes power supply positioning information indicating a position of the power supply, feed line positioning information indicating a position of the feed line connected to the power supply, and thermal line positioning information indicating a position of the thermal line along the feed line,
the controller comprises a distance information obtainer and an abnormality site display processor, and the distance information obtainer is configured to, in response to the abnormality detector detecting an abnormality of the thermal line, obtain distance information indicating a distance from the power supply to a location of the abnormality, and
the abnormality site display processor is configured to perform:
an abnormality site estimation process that estimates a location of an abnormality site based on the distance information, the abnormality site is a site of the abnormality of the thermal line, and a display process of causing the display device to display a map indicating the position of the thermal line based on the map data and to display, on the map, an estimated position of the abnormality site estimated through the abnormality site estimation process.

2. The abnormality locating system according to claim 1, wherein:
the feed line and the thermal line extend from the power supply along the movement path and return to the power supply, and
in the abnormality site estimation process, the abnormality site display processor estimates, as the location of the abnormality site, a position away from the power supply by a distance indicated by the distance information along the thermal line.

3. The abnormality locating system according to claim 2, wherein:
the thermal line is included in a circulation path extending from the power supply and returning to the power supply,
in the abnormality site estimation process, the abnormality site display processor estimates a first position and a second position each as the location of the abnormality site, the first position is away from the power supply by the distance indicated by the distance information along the circulation path on a first side in a circulation direction of the circulation path, the second position is away from the power supply by the distance indicated by the distance information along the circulation path on a second side in the circulation direction, and the second side is opposite to the first side, and
in the display process, the abnormality site display processor causes each of the first position and the second position to be displayed on the map as the estimated position of the abnormality site.

4. The abnormality locating system according to claim 1, wherein:
the controller is configured to receive an abnormality site display operation for causing displaying of the abnormality site,
when the abnormality site display operation is yet to be received, the abnormality site display processor causes, in the display process, the display device to display both the power supply and the estimated position of the abnormality site on the map or to display an entire path of a portion of the thermal line which portion extends from the power supply to the estimated position of the abnormality site on the map, and
in response to the controller receiving the abnormality site display operation, the abnormality site display processor causes, in the display process, the display device to display a portion of the map which portion indicates an area around the estimated position of the abnormality site.

5. The abnormality locating system according to claim 1, wherein:
in the display process, the abnormality site display processor highlights a path of a first portion of the thermal line which first portion extends from the power supply to the estimated position of the abnormality site over a path of a second portion of the thermal line.

6. The abnormality locating system according to claim 1, wherein:
the controller is configured to receive a video reproduction request operation, and in response to the controller receiving the video reproduction request operation, the abnormality site display processor performs, in the display process, a video reproduction process of causing the display device to display the map while moving a base position over the map displayed on the display device along a path of a portion of the thermal line which portion extends from the power supply to the estimated position of the abnormality site.

* * * * *